(12) United States Patent
Babushkin et al.

(10) Patent No.: US 11,658,597 B1
(45) Date of Patent: May 23, 2023

(54) SINGLE-SHUNT CURRENT MEASUREMENT

(71) Applicant: Allegro MicroSystems, LLC, Manchester, NH (US)

(72) Inventors: Anton Babushkin, Kyiv (UA); Serhii Korol, Kyiv (UA); Yaroslav Smirnov, Kyiv (UA); Dmytro Sakharov, Kyiv (UA); Masahira Kurihara, Prague (CZ); Kamyar Khosravi, Manchester, NH (US); Vadym Khudobets, Kyiv (UA)

(73) Assignee: Allegro MicroSystems, LLC, Manchester, NH (US)

( * ) Notice: Subject to any disclaimer, the term of this patent is extended or adjusted under 35 U.S.C. 154(b) by 37 days.

(21) Appl. No.: 17/645,118

(22) Filed: Dec. 20, 2021

(51) Int. Cl.
*H02P 23/14* (2006.01)
*G01R 29/02* (2006.01)
*H02P 29/00* (2016.01)

(52) U.S. Cl.
CPC .............. *H02P 23/14* (2013.01); *G01R 29/02* (2013.01); *H02P 29/00* (2013.01)

(58) Field of Classification Search
CPC .......... H02P 23/14; H02P 29/00; G01R 29/02
USPC ........................................ 318/445, 599, 560
See application file for complete search history.

(56) References Cited

U.S. PATENT DOCUMENTS

| | | | |
|---|---|---|---|
| 5,708,578 A | 1/1998 | Stoddard et al. | |
| 10,312,847 B2 | 6/2019 | Lu | |
| 10,348,223 B1 | 7/2019 | Khosravi et al. | |
| 10,511,244 B2 * | 12/2019 | Ishino | H02P 6/185 |
| 10,784,810 B1 | 9/2020 | Lu | |
| 10,804,822 B2 | 10/2020 | Alcorn et al. | |
| 10,819,257 B1 | 10/2020 | Khosravi et al. | |
| 10,873,280 B2 | 12/2020 | Lu et al. | |
| 10,924,052 B1 | 2/2021 | Khosravi et al. | |
| 2020/0021212 A1 | 1/2020 | Yamada et al. | |
| 2020/0028456 A1 | 1/2020 | Morioka et al. | |
| 2020/0235682 A1 | 7/2020 | Khosravi et al. | |
| 2020/0295682 A1 | 9/2020 | Lu | |
| 2020/0313637 A1 | 10/2020 | Daubert et al. | |

OTHER PUBLICATIONS

U.S. Appl. No. 17/161,780, filed Jan. 29, 2021, Khosravi, et al.
U.S. Appl. No. 17/648,165, filed Jan. 17, 2022, Foletto, et al.

* cited by examiner

*Primary Examiner* — David Luo
(74) *Attorney, Agent, or Firm* — Daly, Crowley, Mofford & Durkee, LLP

(57) ABSTRACT

A method comprising: receiving a first current measurement that is taken at a first predetermined time instant; receiving a second current measurement that is taken at a second predetermined time instant; classifying the first current measurement as corresponding to one of a plurality of electrical signals, the first current measurement being classified based, at least in part, on a duty cycle pattern of the plurality of electrical signals; classifying the second current measurement as corresponding to another one of the plurality of electrical signals, the second current measurement being classified based, at least in part, on the duty cycle pattern of the plurality of electrical signals; and adjusting a duty cycle of at least one of the electrical signals based on the first current measurement, the classification of the first current measurement, the second current measurement, and the classification of the second current measurement.

25 Claims, 8 Drawing Sheets

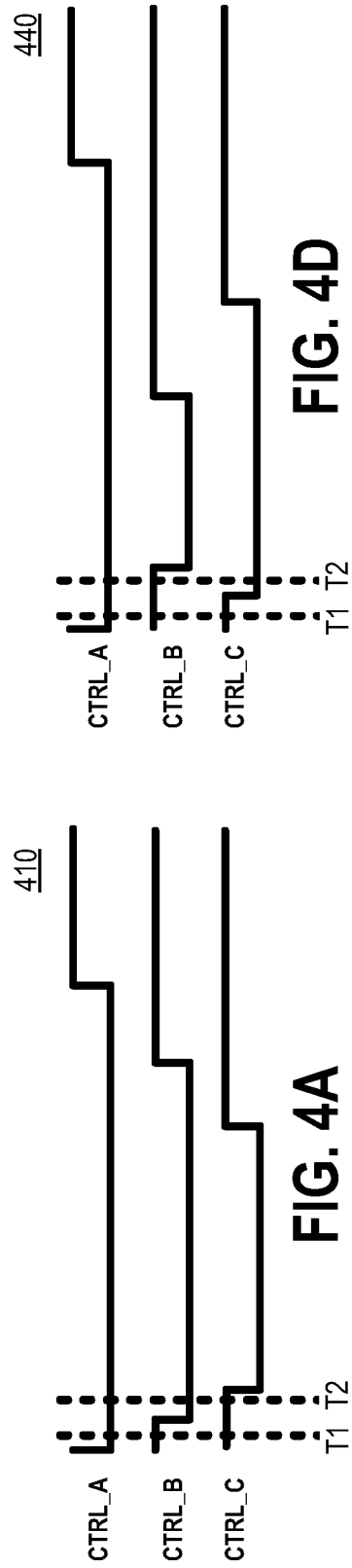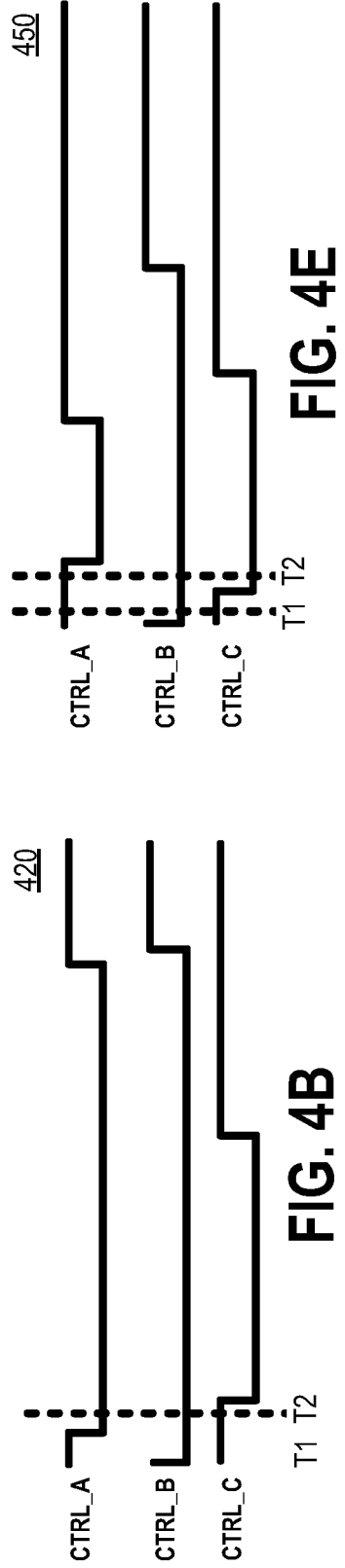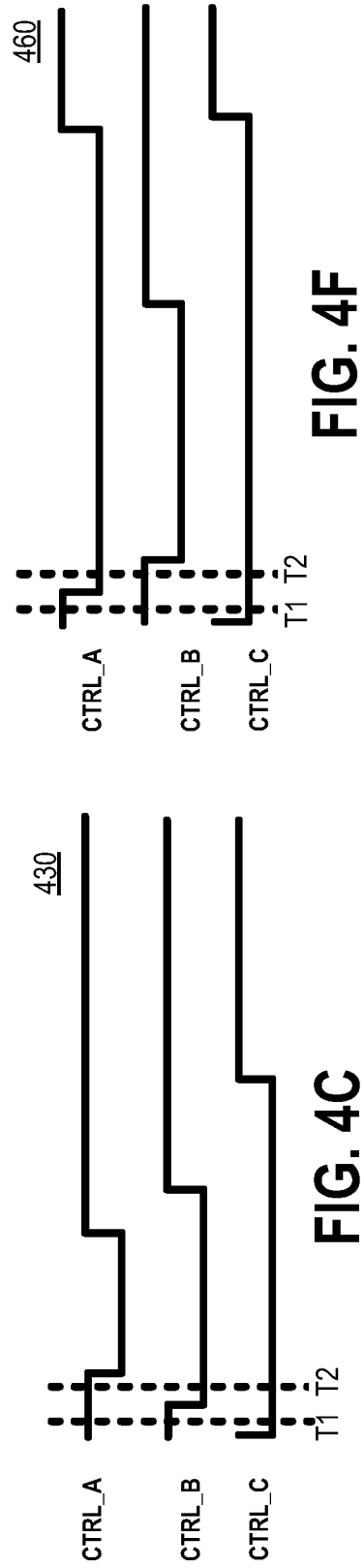

SINGLE-SHUNT CURRENT MEASUREMENT

BACKGROUND

Circuits to control and regulate electric motors, such as brushless DC ("BLDC") motors, are required in many applications. In many instances it is useful to know the average supply current provided to the motor to drive the motor in a controlled way. Additionally, the average supply current can be useful to measure power consumption of the motor. Phase currents can be measured with shunt resistors. The use of shunt resistors is an inexpensive approach and three phase motor systems can use one, two or three shunt resistors. Correct timing of current measurements is paramount for achieving high performance of motor control systems.

SUMMARY

According to aspects of the disclosure, a method is provided for use in a controller, the method comprising: receiving a first current measurement that is taken at a first predetermined time instant; receiving a second current measurement that is taken at a second predetermined time instant; classifying the first current measurement as corresponding to one of a plurality of electrical signals, the first current measurement being classified based, at least in part, on a duty cycle pattern of the plurality of electrical signals; classifying the second current measurement as corresponding to another one of the plurality of electrical signals, the second current measurement being classified based, at least in part, on the duty cycle pattern of the plurality of electrical signals; and adjusting a duty cycle of at least one of the electrical signals based on the first current measurement, the classification of the first current measurement, the second current measurement, and the classification of the second current measurement, wherein the first current measurement and the second current measurement are taken by using a same shunt resistor.

According to aspects of the disclosure, a system is provided, comprising: a processing circuitry that is configured to: receive a first current measurement that is taken at a first predetermined time instant; receive a second current measurement that is taken at a second predetermined time instant; classifying the first current measurement as corresponding to one of a plurality of electrical signals, the first current measurement being classified based, at least in part, on a duty cycle pattern of the plurality of electrical signals; classifying the second current measurement as corresponding to another one of the plurality of electrical signals, the second current measurement being classified based, at least in part, on the duty cycle pattern of the plurality of electrical signals; and adjusting a duty cycle of at least one of the electrical signals based on the first current measurement, the classification of the first current measurement, the second current measurement, and the classification of the second current measurement, wherein the first current measurement and the second current measurement are taken by using a same shunt resistor.

According to aspects of the disclosure, a non-transitory computer-readable medium is provided that stores one or more processor executable instructions, which when executed by a processing circuitry, further cause the processing circuitry to perform the operations of: receiving a first current measurement that is taken at a first predetermined time instant; receiving a second current measurement that is taken at a second predetermined time instant; classifying the first current measurement as corresponding to one of a plurality of electrical signals, the first current measurement being classified based, at least in part, on a duty cycle pattern of the plurality of electrical signals; classifying the second current measurement as corresponding to another one of the plurality of electrical signals, the second current measurement being classified based, at least in part, on the duty cycle pattern of the plurality of electrical signals; and adjusting a duty cycle of at least one of the electrical signals based on the first current measurement, the classification of the first current measurement, the second current measurement, and the classification of the second current measurement, wherein the first current measurement and the second current measurement are taken by using a same shunt resistor.

According to aspects of the disclosure, a system is provided, comprising: a motor including a plurality of windings; an electronic circuit configured to drive a different one of the plurality of windings with a different one of a plurality of electrical signals, each of the plurality of electrical signals being a pulse-width modulation (PWM) signal; a shunt resistor that is coupled in series with the electronic circuit; a processing circuitry that is operatively coupled the electronic circuit, the processing circuitry being configured to: obtain of a first current measurement by using the shunt resistor, the first current measurement being taken at a first predetermined time instant; obtain a second current measurement by using the shunt resistor, the second current measurement being taken at a second predetermined time instant; classify the first current measurement as corresponding to one of a plurality of electrical signals, the first current measurement being classified based, at least in part, on a duty cycle pattern of the plurality of electrical signals; classify the second current measurement as corresponding to another one of the plurality of electrical signals, the second current measurement being classified based, at least in part, on the duty cycle pattern of the plurality of electrical signals; and adjust a duty cycle of at least one of the electrical signals based on the first current measurement, the classification of the first current measurement, the second current measurement, and the classification of the second current measurement.

According to aspects of the disclosure, a system is provided comprising: means for receiving a first current measurement that is taken at a first predetermined time instant; means for receiving a second current measurement that is taken at a second predetermined time instant; means for classifying the first current measurement as corresponding to one of a plurality of electrical signals, the first current measurement being classified based, at least in part, on a duty cycle pattern of the plurality of electrical signals; means for classifying the second current measurement as corresponding to another one of the plurality of electrical signals, the second current measurement being classified based, at least in part, on the duty cycle pattern of the plurality of electrical signals; and means for adjusting a duty cycle of at least one of the electrical signals based on the first current measurement, the classification of the first current measurement, the second current measurement, and the classification of the second current measurement.

BRIEF DESCRIPTION OF THE DRAWINGS

The foregoing features may be more fully understood from the following description of the drawings in which:

FIG. 4A is a graph illustrating an example of a duty cycle pattern, according to aspects of the disclosure;

FIG. 4B is a graph illustrating an example of a duty cycle pattern, according to aspects of the disclosure;

FIG. 4C is a graph illustrating an example of a duty cycle pattern, according to aspects of the disclosure;

FIG. 4D is a graph illustrating an example of a duty cycle pattern, according to aspects of the disclosure;

FIG. 4E is a graph illustrating an example of a duty cycle pattern, according to aspects of the disclosure;

FIG. 4F is a graph illustrating an example of a duty cycle pattern, according to aspects of the disclosure;

DETAILED DESCRIPTION

Figure 1:
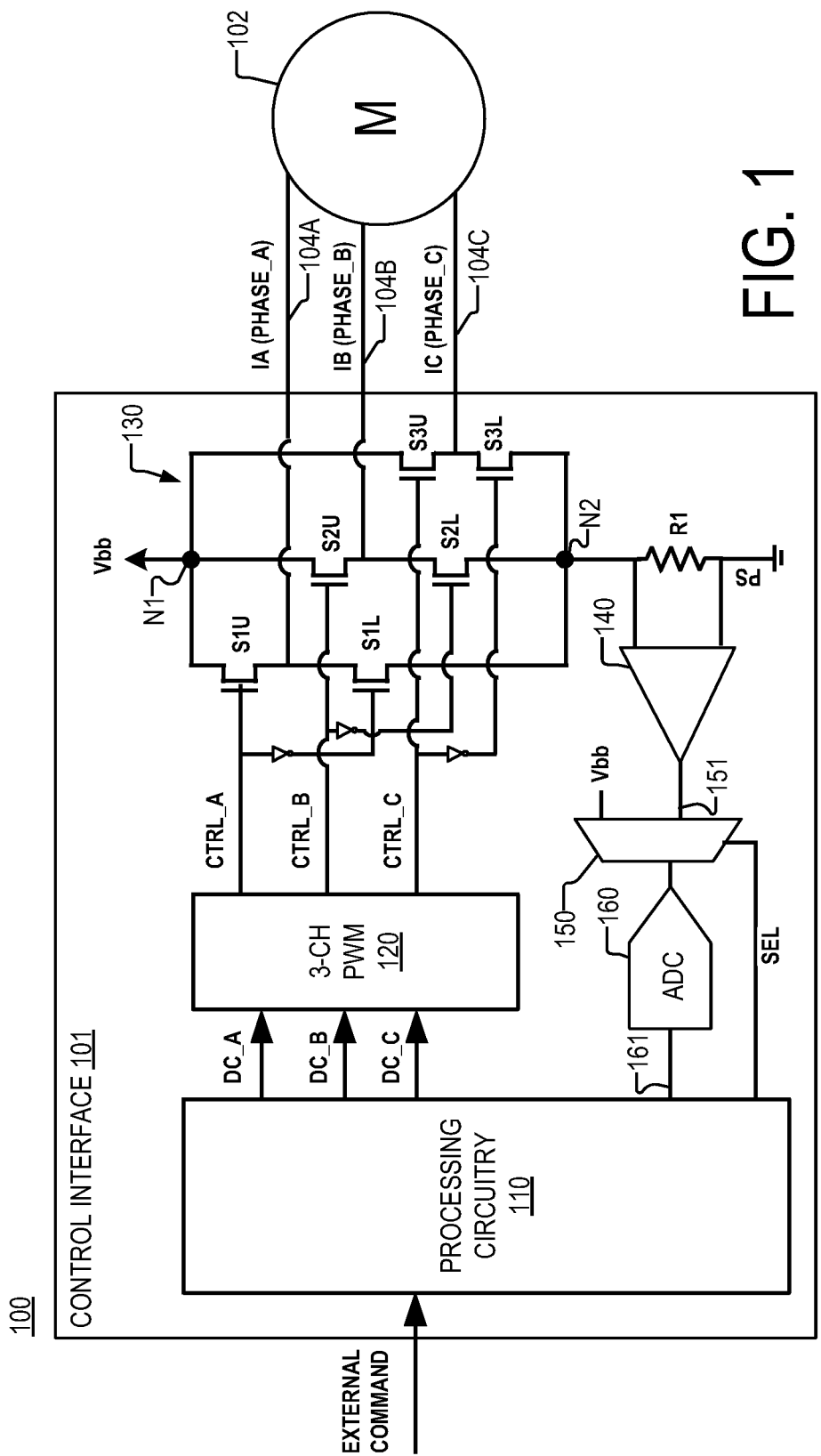
FIG. 1 is a diagram of an example of a motor control system, according to aspects of the disclosure.

FIG. 1 is a diagram of an example of a motor control system 100, according to aspects of the disclosure. The system 100 may include a control interface 101 and a motor 102. The control interface 101 is configured to measure the currents that are supplied to different windings of the motor 102. The current measurements are performed by using a single shunt resistor R1 and a classification process that classifies individual current measurements as belonging to one winding or another. The current measurements can be used to control the motor 102.

The motor 102, according to the present example, is a 3-phase electrical motor. However, alternative implementations are possible in which the motor is a 5-phase motor and/or any other multi-phase motor. The motor 102 may be powered by electrical signals IA, IB, and IC. Each of the electrical signals IA, IB, and IC may have a different phase. Each of the electrical signals IA, IB, and IC may be a PWM signal. Signals IA, IB, and IC may be supplied on lines 104A, 104B, and 104C, respectively. Each of lines 104A, 104B, and 104C may be electrically coupled to a different winding of the motor 102, such that each of the electrical signals IA, IB, and IC is supplied to a different winding of the motor 102.

Each of the electrical signals IA, IB, and IC may be generated by the control interface 101 in response to an external command that is received by the control interface 101. The external command can be any of a speed command, a torque command, a power command, and/or any other command for controlling the operation of the motor 102. The external command may be generated by an engine control unit (ECU) of a vehicle, a controller of industrial equipment, an appliance controller, and/or another computing device (or control circuit) that is operatively coupled to the control interface 101.

The control interface 101 may include a processing circuitry 110, a pulse-width modulation (PWM) generator 120, a switching circuit 130, a differential amplifier 140, a multiplexer 150, and an analog-to-digital converter 160.

The processing circuitry 110 may include one or more of a general-purpose processor, an application-specific integrated circuit (ASIC), a field-programmable gate array (FPGA), and or any suitable type of processing circuitry.

The processing circuitry may be configured to generate signals DC_A, DC_B, and DC_C. Signals DC_A, DC_B, and DC_C specify characteristics of signals IA, IB, and IC, respectively, such as duty cycle, on-time, and off-time. More particularly, signals DC_A, DC_B, and DC_C specify the characteristics of signals IA, IB, and IC in terms of the duration of a PWM cycle. The PWM cycle may be a reference time period that is used by the processing circuitry 110 to control the operation of motor 102. For example, the PWM cycle may have a duration that is equal to 500 clock cycles, 0.5 milliseconds, etc. It will be understood that the present disclosure is not limited to any specific method for defining the duration of a PWM cycle and/or any specific duration of the PWM cycle.

Signal DC_A may specify the duty cycle of signal IA in terms of the PWM cycle duration. Specifically, signal DC_A may specify the proportion (or percentage) of the PWM cycle in which the signal IA will be set to "logic-high". Additionally or alternatively, signal DC_A may identify a first instant in the PWM cycle when the signal IA will transition from logic-high to logic-low. Additionally or alternatively, signal DC_A may identify a second instant in the PWM cycle, when the signal IA will transition from logic-low to logic-high. Signal DC_A may be a digital signal.

Signal DC_B may specify the duty cycle of signal IB in terms of the PWM cycle. Specifically, signal DC_B may specify the proportion (or percentage) of the PWM cycle in which the signal IB will be set to "logic-high". Additionally or alternatively, signal DC_B may identify a first instant in the PWM cycle when the signal IB will transition from logic-high to logic-low. Additionally or alternatively, signal DC_B may identify a second instant in the PWM cycle, when the signal IB will transition from logic-low to logic-high. Signal DC_B may be a digital signal.

Signal DC_C may specify the duty cycle of signal IC in terms of the PWM cycle. Specifically, signal DC_C may specify the proportion (or percentage) of the PWM cycle in which the signal IC will be set to "logic-high". Additionally or alternatively, signal DC_C may identify a first instant in the PWM cycle when the signal IC will transition from logic-high to logic-low. Additionally or alternatively, signal DC_C may identify a second instant in the PWM cycle, when the signal IC will transition from logic-high to logic-low. Signal DC_C may be a digital signal.

The PWM generator 120 may include an electronic circuit that is configured to generate control signals CTRL_A, CTRL_B, and CTRL_C. Signal CTRL_A may be an analog signal that is generated based on digital signal DC_A. Signal CTRL_A may be configured to turn transistors S1U and S1L on and off in a way that imparts on signal IA the characteristics (e.g., duty cycle and phase, etc.) that are specified signal DC_A. Signal CTRL_B may be an analog signal that is generated based on digital signal DC_B. Signal CTRL_B may be configured to turn transistors S2U and S2L on and off in a way that imparts on signal IB the characteristics (e.g., duty cycle and phase, etc.) that are specified signal DC_B. Signal CTRL_C may be an analog signal that is generated based on digital signal DC_C. Signal CTRL_C may be configured to turn transistors S3U and S3L on and off in a way that imparts on signal IC the characteristics (e.g., duty cycle and phase, etc.) that are specified signal DC_C.

The switching circuit 130 may include a transistor bridge that is coupled to a voltage source at node N1 and a ground source at node N2. The transistor bridge includes three branches that are coupled in parallel between nodes N1 and N2, and which are herein referred to as "a first branch", "a second branch", and "a third branch". The first branch may include an upper transistor S1U and a lower transistor S1L. The transistors S1U and S1L may be controlled by signal CTRL_A. When the signal CTRL_A is set to a first value (e.g., logic-low'), the lower transistor S1L may be turned on and the upper transistor S1U may be turned off. When the signal CTRL_A is set to a second value (e.g., 'logic-high'), the lower transistor S1L may be turned off and the upper transistor S1U may be turned on. The second branch may include an upper transistor S2U and a lower transistor S2L. The transistors S2U and S2L may be controlled by signal CTRL_B. When the signal CTRL_B is set to a second value (e.g., 'logic-low'), the lower transistor S2L may be turned on and the upper transistor S2U may be turned off. When the signal CTRL_B is set to a second value (e.g., 'logic-high'), the lower transistor S2L may be turned off and the upper transistor S2U may be turned on. The third branch may include an upper transistor S3U and a lower transistor S3L. The transistors S3U and S3L may be controlled by signal CTRL_C. When the signal CTRL_C is set to a third value (e.g., 'logic-low'), the lower transistor S3L may be turned on and the upper transistor S3U may be turned off. When the signal CTRL_C is set to a third value (e.g., 'logic-high'), the lower transistor S3L may be turned off and the upper transistor S3U may be turned on.

Shunt resistor R1 may be coupled between node N2 and ground. Differential amplifier 140 may measure the voltage drop across shunt resistor R1 and provide, to the ADC 160, a signal 151 that is indicative of the voltage drop. For example, the amplifier 140 may subtract the voltage at one of its inputs from the voltage at the other and may amplify the resulting voltage. The signal 151 may be provided to the ADC 160 via multiplexer 150. The multiplexer 150 may be configured to multiplex the signal provided by the voltage source at node N1 (Vbb) and the signal 151. In some implementations, the multiplexer 150 may be configured to measure other signals that are desired to be measured, as well. The output of the multiplexer 150 may be selected by a selection signal SEL that is generated by the processing circuitry 110. The ADC 160 may digitize signal 151 to produce a signal 161, which is subsequently provided to the processing circuitry.

Under the nomenclature of the present disclosure, the value of signal 151 at any given time instant is referred to as a "current measurement" because it is indicative of the current that is flowing through the switching circuit 130.

Depending on the time instant at which the signal 151 is sampled, the resulting current measurement may be indicative of the current that is provided on a different one of lines 104A, 104B, and 104C. For instance, if the signal 151 is sampled at a time instant T1, the resulting current measurement may be indicative of the current on a first one of lines 104A, 104B, and 104C. Afterwards, when the signal 151 is sampled at a time instant T2, the resultant current measurement may be indicative of the current on a second one of lines 104A, 104B, and 104C. As is discussed in more detail below, the exact classification of current measurements resulting from signal 151 may be performed based on the duty cycle pattern of signals IA, IB, and IC, in addition to the timing of the current measurements. Selecting the sampling times in this manner is advantageous because it provides a single universal method for calculating PWM switching points, which is not influenced by the current measurement system and ensures accuracy of the current measurements that are taken by the processing circuitry 110.

Figure 2:
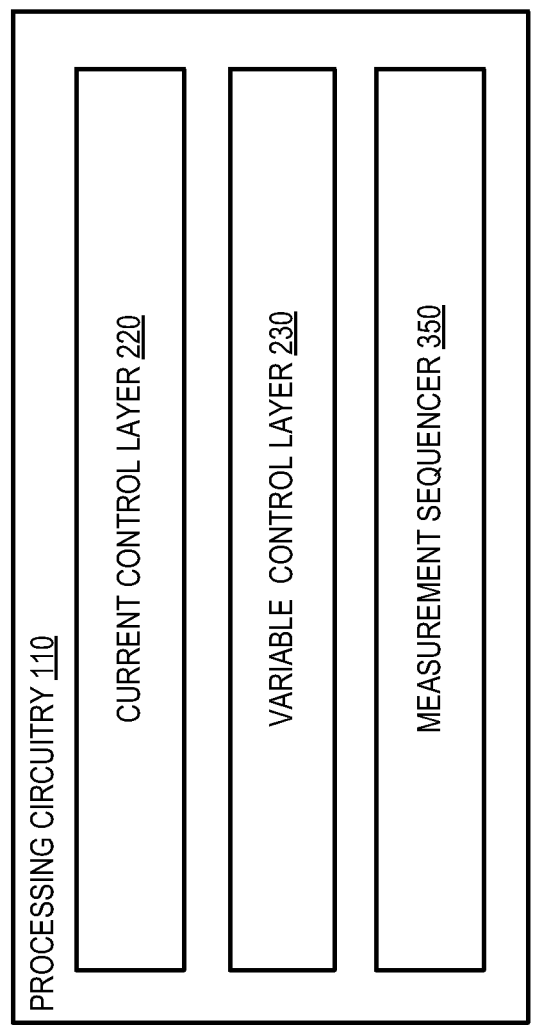
FIG. 2 is a diagram of an example of a processing circuitry that is part of the motor control system of FIG. 1, according to aspects of the disclosure.

FIG. 2 is a diagram illustrating an example of one configuration of processing circuitry 110. As illustrated, the processing circuitry may include a measurement sequencer 350, a current control layer (CCL) 220, and a variable control layer (VCL) 230. The measurement sequencer 350 may include logic for determining the current that is being supplied on any two of lines 104A-C (shown in FIG. 1). The CCL 220 may include logic that regulates the direct and quadrature current of the motor 102. The VCL 230 may include logic that controls CCL 220 to achieve motor ramp-up to a certain configurable speed with a configurable rate. Furthermore, VCL 230 may include logic that is configured to achieve a certain parameter of the operation of the motor 102. For example, VCL 230 may include logic that is configured to achieve a desired speed or power of the motor 102. Specifically, the VCL may take a desired value of the parameter and command direct and quadrature references for the CCL 220, which would result in motor 102 operating in accordance with the desired value of the operational parameter. In one specific example, the VCL 230 may command desired direct and quadrature currents which would result in the motor 102 having a desired speed or a desired power. The desired speed or power may be determined based on an external command received at the processing circuitry 110. The functions performed by the measurement sequencer 350 are discussed further below with respect to FIG. 3.

Figure 3:
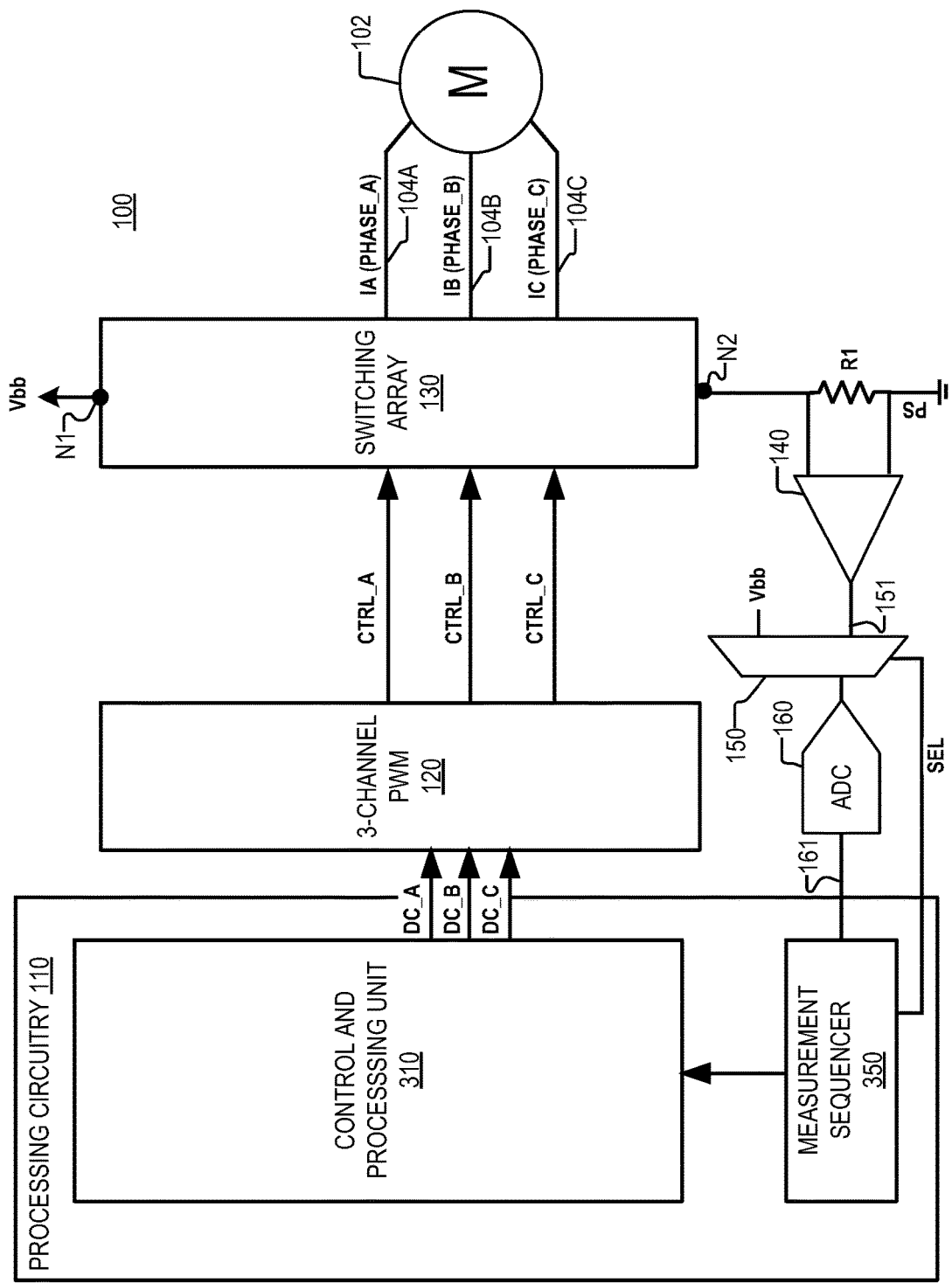
FIG. 3 is a diagram of an example of a motor control system, according to aspects of the disclosure.

FIG. 3 is a diagram of the system 100, in accordance with another aspect of the disclosure. More particularly, FIG. 3 shows one particular implementation of the processing circuitry 110 in which the processing circuitry 110 includes a central processing unit (CPU) 310 and a measurement sequencer 350.

The CPU 310 may include any suitable type of processor or processing circuitry. The measurement sequencer 350 may include electronic circuitry that is configured to measure the current on any two of lines 104A-C (shown in FIG. 1). The measurement sequencer may also be configured to synchronize the taking of measurements of the current through the switching circuit 130 (i.e., current through shunt resistor R1) in response to events that are generated by a timer.

In some implementations, the measurement sequencer 350 may include logic generating interrupts. As is discussed further below, the measurement sequencer 350 may take two consecutive current measurements in each PWM cycle of the signals IA, IB, and IC. When two consecutive current measurements are taken in a given PWM cycle, the measurement sequencer 350 may store the measurements in corresponding memory locations, and generate one or more interrupts which trigger further processing of the current measurements by the CPU 310.

The CPU 310 may be configured to receive measurements of the current on two of lines 104A, 104B, and 104C. Next, the CPU 310 may identify which lines exactly the two current measurements correspond to (i.e., the CPU 310 may identify which line each current measurement corresponds to). Next, the CPU 310 may calculate the current on the third one of lines 104A, 104B, and 104C. Next, the CPU 310 may generate, based on the three current measurements, the signals DC_A, DC_B, and DC_C, and provide those signals to the PWM generator 120.

FIGS. 4A-E illustrate different duty cycle patterns for signals IA, IB, and IC. FIGS. 4A-E show the values of signals CTRL_A, CTRL_B, and CTRL_C over the course of a full PWM cycle. As illustrated in FIG. 3, signals CTRL_A, CTRL_B, and CTRL_C may have the same waveform as signals IA, IB, and IC, respectively. It this this regard, the phrases "duty cycle of signals CTRL_A, CTRL_B, and CTRL_C" and "duty cycle of signals IA, IB, and IC can be used interchangeably throughout the disclosure. —FIG. 4A-E are presented in the context of a method in which the values of signals CTRL_A, CTRL_B, and CTRL_C are based on: 1) calculated values of signals DC_A, DC_B, and DC_C; 2) the mutual relation of those values. Also, position of current sampling time instants T1 and T2 is shown on in FIGS. 4A-E in relation to signals CTRL_A, CTRL_B, and CTRL_C. More particularly, FIG. 4A shows a an example of a sequence of toggling of signals CTRL_A, CTRL_B, and CTRL_C and sampling time instants T1, T2 in accordance with a duty cycle pattern 410, in which the signal CTRL_A has the shortest duty cycle, signal CTRL_B has the second shortest duty cycle, and signal CTRL_C has the longest duty cycle. FIG. 4B shows an example of a sequence of toggling of signals CTRL_A, CTRL_B, and CTRL_C and sampling time instants T1, T2 in accordance with a duty cycle pattern 420, in which the signal CTRL_B has the shortest duty cycle, signal CTRL_A has the second shortest duty cycle, and signal CTRL_C has the longest duty cycle. FIG. 4C shows an example of a sequence of toggling of signals CTRL_A, CTRL_B, and CTRL_C and sampling time instants T1, T2 in accordance with a duty cycle pattern 430, in which the signal CTRL_C has the shortest duty cycle, signal CTRL_B has the second shortest duty cycle, and signal CTRL_A has the longest duty cycle. FIG. 4D shows an example of a sequence of toggling of signals CTRL_A, CTRL_B, and CTRL_C and sampling time instants T1, T2 in accordance with a duty cycle pattern 440, in which the signal CTRL_A has the shortest duty cycle, signal CTRL_C has the second shortest duty cycle, and signal CTRL_B has the longest duty cycle. FIG. 4E shows an example of a sequence of toggling of signals CTRL_A, CTRL_B, and CTRL_C and sampling time instants T1, T2 in accordance with a duty cycle pattern 450, in which the signal CTRL_B has the shortest duty cycle, signal CTRL_C has the second shortest duty cycle, and signal CTRL_A has the longest duty cycle. FIG. 4F shows an example of a sequence of toggling of signals CTRL_A, CTRL_B, and CTRL_C and sampling time instants T1, T2 in accordance with a duty cycle pattern 460, in which the signal CTRL_C has the shortest duty cycle, signal CTRL_A has the second shortest duty cycle, and signal CTRL_B has the longest duty cycle.

Each of FIGS. 4A-F shows time instants T1 and T2 in a respective PWM cycle. Time instants T1 and T2 are instants in which signal 151 is sampled by the processing circuitry 110 (e.g., with the help of ADC 160). As illustrated, time instants T1 and T2 are at the very beginning of each PWM cycle. Furthermore, in each PWM cycle, the current on only two of lines 104A, 104B, and 104C is measured, and the current on the third one of lines 104A, 104B, and 104C is determined mathematically (i.e., calculated rather than measured empirically) based on the measurements of the current on the other two lines. In some implementations, calculating the third current measurement may be faster than measuring it empirically.

Figure 5:
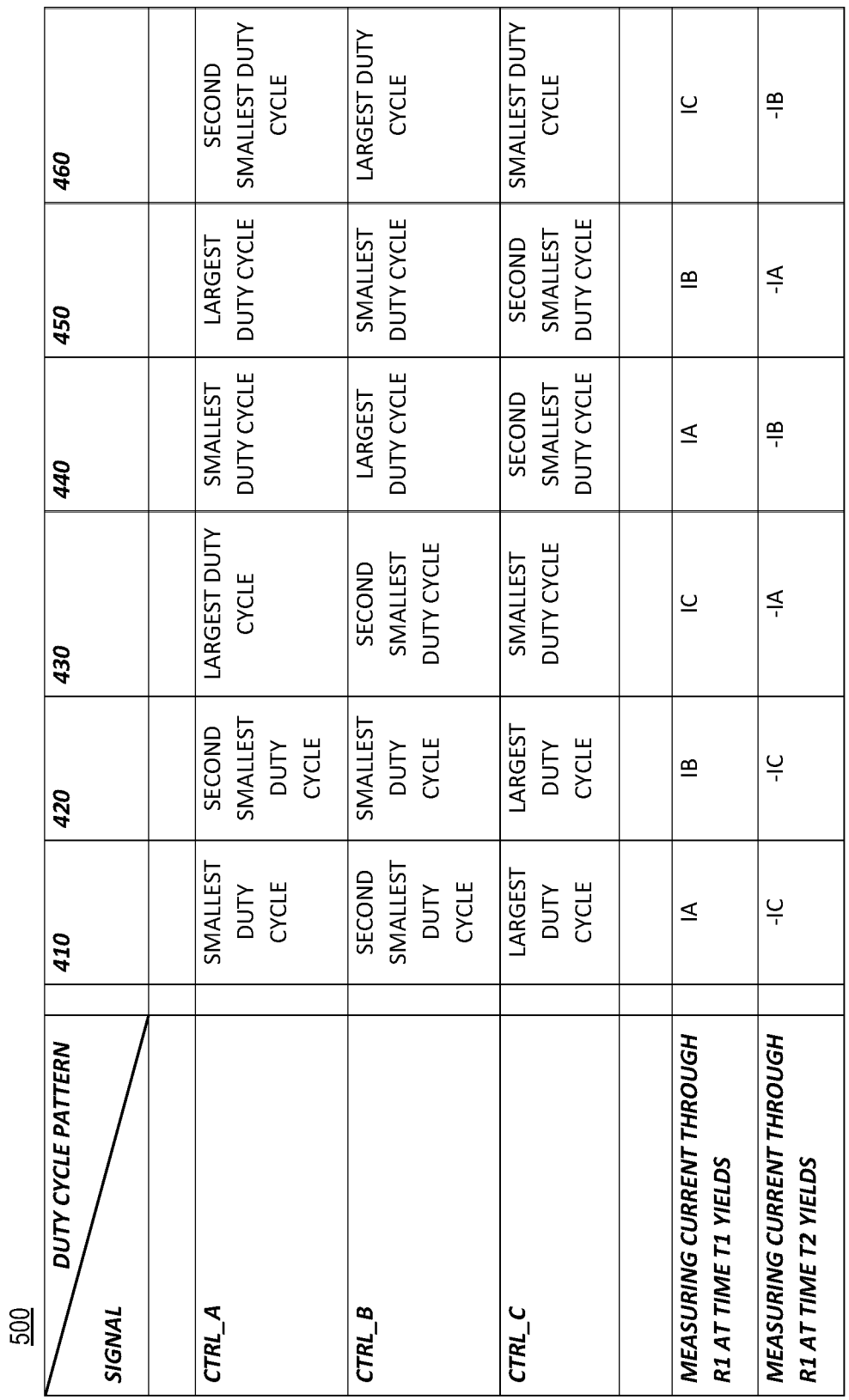
FIG. 5 is a table mapping different switching patterns to corresponding current measurements, according to aspects of the disclosure.

FIG. 5 shows a table 500, which identifies different current measurements that can be taken at times T1 and T2 (shown in FIGS. 4A-E) in any given PWM cycle. Table 5 illustrates that when the current through shunt resistor R1 is measured at time T1, in any given PWM cycle, the measurement will yield the current level of one of signals IA, IB, and IC, which has the smallest duty cycle during the given PWM cycle. Table 5 further illustrates that when the current through shunt resistor R1 is measured at time T2, in any given PWM cycle, the measurement will yield the negative of the current level of one signals IA, IB, and IC, which has the largest duty cycle during the given PWM cycle.

Figure 6:
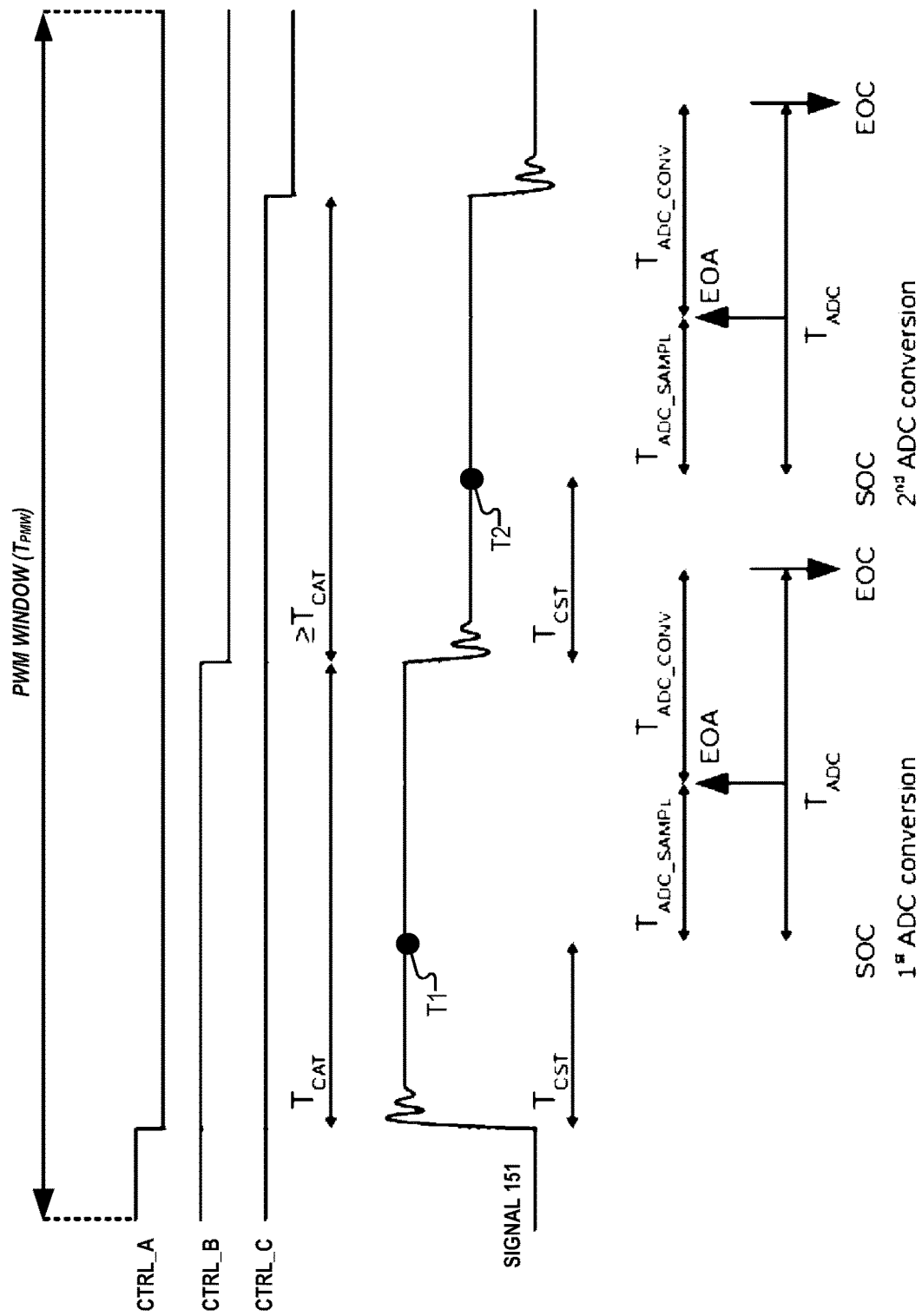
FIG. 6 is a signal graph illustrating aspects of the operation of a motor control system, according to aspects of the disclosure.

FIG. 6 is a signal graph showing some timing constraints, which the system 100 may be subjected to in some of its implementations. FIG. 6 illustrates that signal 151 experiences a ripple every time one of the signals IA, IB, and IC transitions from logic-high to logic-low. The duty cycle pattern illustrated in FIG. 6 is duty cycle pattern 410. Time instants T1 and T2, at which the signal 151 is sampled, occur after a period $T_{CST}$ has passed after one of the signals IA, IB, and IC changes its value. According to the example of FIG. 6, the sampling of signal 151 is synchronized with state transitions performed by signals IA, IB, and IC, and the processing circuitry waits for time period $T_{CST}$ after any such transition before sampling the signal 151 to allow the ripple in the signal 151 to settle. The signal 151 is sampled with ADC 160. The conversion time of ADC is denoted $T_{ADC\_CONV}$. The sampling time of ADC 160 is denoted $T_{ADC\_SAMPL}$. In some implementations, to ensure proper current measurement at times T1 and T2, the condition of $T_{CAT} >= T_{CST} + T_{ADC\_SAMPL}$ must hold true.

Figure 7:
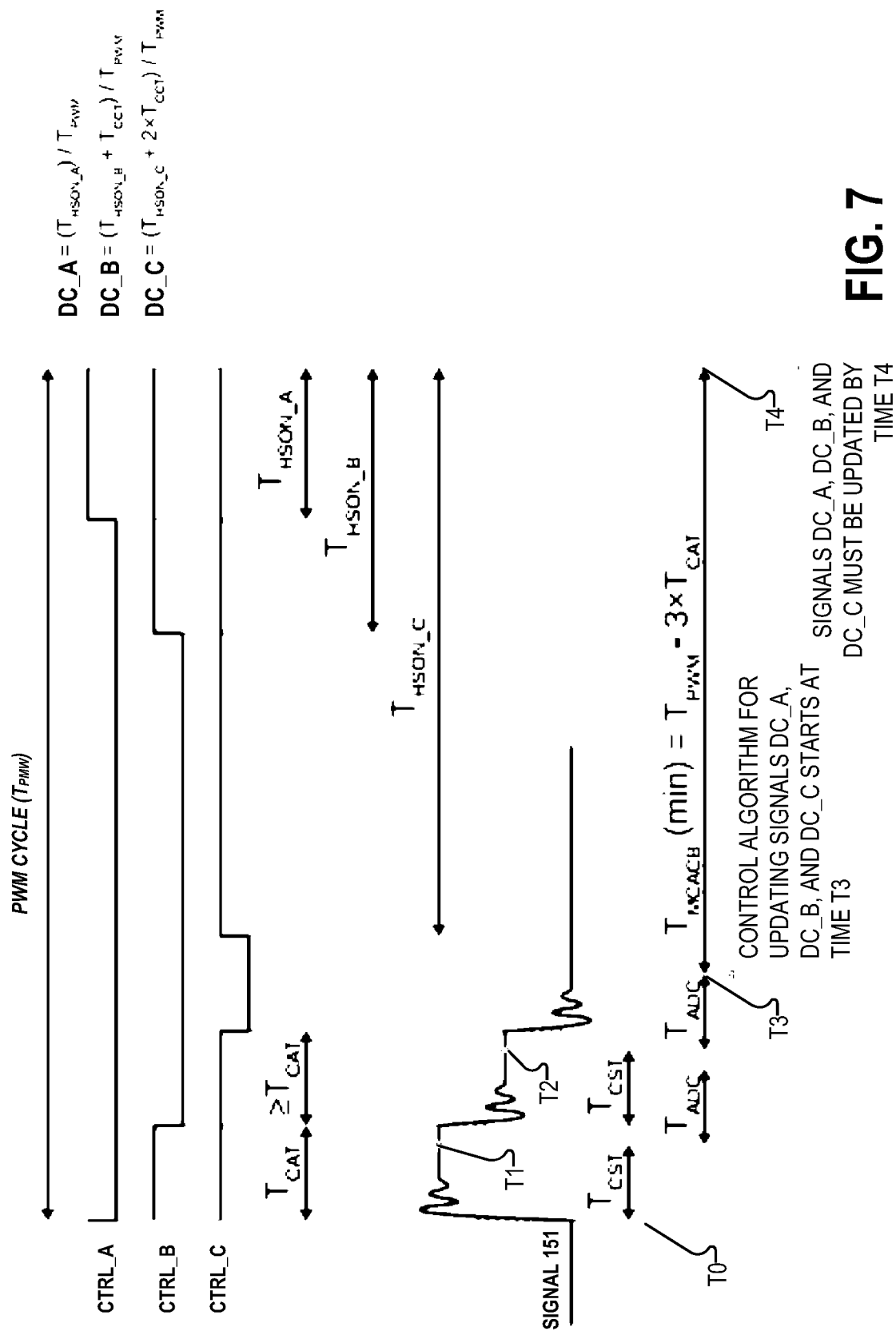
FIG. 7 is a signal graph illustrating aspects of the operation of a motor control system, according to aspects of the disclosure.

FIG. 7 is a signal graph showing some timing constraints, which the system 100 may be subjected to in some of its implementations. The duty cycle pattern illustrated in FIG. 7 is duty c cycle pattern 410. The PWM cycle ($T_{PWM}$) over which the duty cycle pattern 410 occurs starts at time T0 and ends at time T4. The taking of the second sample of signal 151 is initiated at time T2 and completed at time T3. The smallest time period between two consecutive transitions of signals IA, IB, and IC from logic-low to logic-high is $T_{CAT}$. The time period between the signal IA transitioning back from logic-low to logic-high and the end T4 of the PWM cycle is $T_{HSON\_A}$. The time period between the signal IB transitioning back from logic-low to logic-high and the end T4 of the PWM cycle is $T_{HSONT\_B}$. The time period between the signal IC transitioning back from logic-low to logic-high and the end T4 of the PWM cycle is $T_{HSONT\_C}$. In some implementations, the relationship between the values of signals DC_A, DC_B, and DC_C which are supplied by the processing circuitry 110 to PWM generator 120 may be described as follows: $DC\_A = (T_{HSON\_A})/T_{PWM}$; $DC\_B = (T_{HSON\_B} + T_{CAT})/T_{PWM}$; $DC\_B = (T_{HSON\_B} + 2T_{CAT})/T_{PWM}$. The values of signals DC_A, DC_B, and DC_B during the next PWM cycle (which follows immediately after the PWM cycle depicted in FIG. 7) can be determined by executing any suitable type of FOC algorithm. The execution of the FOC algorithm must last at most for the duration of a period $T_{MCACB}$, which starts at time T3 and ends at time T4. The smallest possible duration of $T_{MCAB}$ must obey the following constraint: $T_{MCACB}(min) = T_{PWM} - 3T_{CAT}$. It will be understood that the present disclosure is not limited to the example of FIG. 7 in any manner.

Together FIGS. 6 and 7 illustrate that sampling times T1 and T2 may be selected based on various timing constraints on the system 100. An example of one such constraint is the ripple that appears in each of the signals IA, IB, and IC when the signal is transitioned from a logic-high value to a logic-low value. Another example of a timing constraint is the conversion time of the ADC 160. In some respects, FIGS. 6 and 7 illustrate that the sampling times T1 and T2 may be selected sufficient time for the ripples in signals IA, IB, and IC to settle, while also allowing sufficient time for the ADC 160 to perform its functions.

FIGS. 6 and 7 further show that the sampling times T1 and T2 may be selected as close as possible to the beginning of a PWM cycle. Doing so allows the control algorithm for updating signals DC_A, DC_B, and DC_C to be executed within the same PWM cycle, and also allows new values for signal DC_A, DC_B, and DC_C to be provided to the PWM module 120 before the end of the same PWM cycle. In other words, it ensures that values of signals DC_A, DC_B, and DC_C can be updated at the beginning of every new PWM cycle. It further ensures that the duty cycle pattern of signals IA, IB, and IC can be changed at the beginning of every new PWM cycle, thus increasing the efficiency at which the motor 102 is operated. This is in contrast to some existing systems, which use a modified PWM cycle, and which cannot ensure that the duty cycles of the signals driving a motor would be updated at even intervals.

In some implementations, sampling times T1 and T2 may be fixed. For example, time T1 may be equal to X clock cycles following the beginning of any given PWM cycle, and time T2 may be equal to Y clock cycles following the beginning of any given PWM cycle. The duration of each PWM cycle may also be fixed. And the control algorithm used to recalculate (or update) the values of signals DC_A, DC_B, and DC_C may be time-bound, and guaranteed to complete in the same PWM cycle in which it has begun executing. The combination of these features permits the system 100 to update the values of signals DC_A, DC_B, and DC_C in every PWM cycle. As noted above, this is in contrast to some existing systems, which use a modified PWM cycle, and which cannot ensure that the duty cycles of the signals driving a motor would be updated at even intervals.

Figure 8:
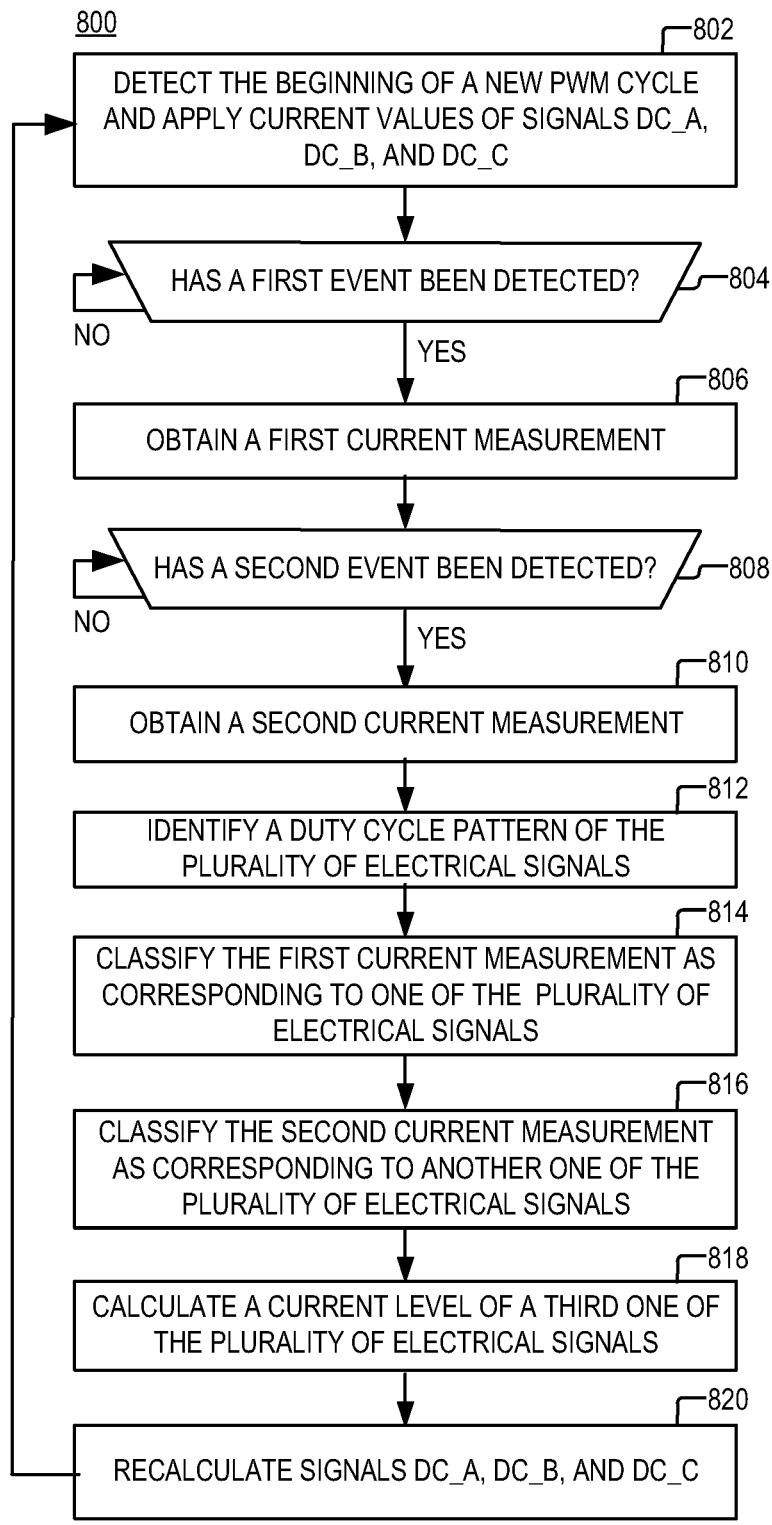
FIG. 8 is a flowchart of an example of a process, according to aspects of the disclosure.

FIG. 8 is a flowchart of an example of a process 800, according to aspects of the disclosure.

At step 802, the processing circuitry 110 detects the beginning of a new PWM cycle and provides the present values of signals DC_A, DC_B, and DC_C to the PWM generator. The current values of signals DC_A, DC_B, and DC_C may be values that have been recalculated at the end of the most recent PWM cycle.

At step 804, the processing circuitry 110 detects whether a first event has occurred. The first event may be one that occurs shortly after the beginning of the PWM cycle. The first event may be generated at time T1 (shown in FIGS. 4A-7). The first event may be generated by using a timer and or any other suitable manner.

At step 806, the processing circuitry 110 samples the signal 151 to obtain a first current measurement.

At step 808, the processing circuitry 110 detects whether a second event has occurred. The second event may be one that occurs shortly after the second. The second event may be generated at time T2 (shown in FIGS. 4A-7). The second event may be generated by using a timer and or any other suitable manner.

At step 810, the processing circuitry 110 samples the signal 151 to obtain a second current measurement.

At step 812, the processing circuitry 110 determines the duty cycle pattern of the signals IA, IB, and IC. The duty cycle pattern may be determined based on the current values of signals DC_A, DC_B, and DC_C and/or in any other suitable manner.

At step 814, the first current measurement (obtained at step 806) is classified as being the measurement of the current level of one of signals IA, IB, and IC. The classification may be performed based on the duty cycle pattern identified at step 812. The classification may be performed by using a data structure, such as table 500 (shown in FIG. 5), to map the first current measurement to a label that identifies the signal to which the first current measurement belongs. Alternatively, the classification may be performed by using digital logic that implements the mappings shown in FIG. 5. Classifying the first current measurement may include storing the first current measurement in a memory register (or at a memory address) that corresponds to the signal to which the first current measurement belongs. However, alternative implementations are possible in which classifying the first current measurement includes generating a label that identifies the signal to which the first current measurement belongs and associating (e.g., appending to, etc.,) the label with the first current measurement.

At step 816 the second current measurement (obtained at step 810) is classified as being the measurement of the current level of another of signals IA, IB, and IC. The classification may be performed based on the duty cycle pattern identified at step 812. The classification may be performed by using a data structure, such as table 500 (shown in FIG. 5). Alternatively, the classification may be performed by using digital logic that implements the mappings shown in FIG. 5. Classifying the second current measurement may include inverting the second current measurement and storing the second current measurement in a memory register (or at a memory address) that corresponds to the signal to which the second current measurement belongs. However, alternative implementations are possible in which classifying the second current measurement includes generating a label that identifies the signal to which the second current measurement belongs and associating (e.g., appending to, etc.,) the label with the second current measurement.

At step 818, the current level of a third one signals IA, IB, and IC is calculated by the processing circuitry 110. The current level of the third one of signals IA, IB, and IC is calculated based on the first current measurement (obtained at step 806) and the second current measurement (obtained at step 810). As noted above, at steps 814 and 816, the first and second current measurements are mapped to different respective ones of signals IA, IB, and IC. In this regard, the third one of signals IA, IB, and IC is the one that has not been mapped to a current measurement yet, and whose level is determined at step 818.

At step 820, the processing circuitry 110 recalculates the signals IA, IB, and IC. More particularly, the processing circuitry 110 recalculates the value of signals IA, IB, and IC by executing a control algorithm, such as the one discussed above with respect to FIG. 2 and FIGS. 6-7. In some respects, the recalculation of signals IA, IB, and IC may amount to selecting a duty cycle pattern for the signals.

As noted above, in some implementations, measurements of the current in lines 104A-C of the motor 102 may be taken at the beginning of each PWM cycle. In some respects, this may guarantee maximum possible and constant time for all required calculations that are performed for recalculation (or at least re-assessment) of the values of signals DC_A, DC_B, and DC_C (or signals IA, IB, and IC). This in turn makes it possible to transfer updated voltage references (signals DC_A, DC_B, DC_C) to the input of the PWM module in the same PWM period (in which the currents were measured). PWM module applies updated control signals CTRL_A, CTRL_B, CTRL_C to the switching array 130 in the next PWM cycle. In some respects, the recalculation of signals DC_A, DC_B, and DC_C amounts to selecting a duty cycle pattern for the signals for the next PWM cycle.

As noted above, the current to motor 102 can be measured at two fixed moments in a PWM cycle. Therefore, the time between when the updated voltages are applied and when the currents are measured is constant and known. This in turn allows measurement delay compensation algorithms to be used to improve measurements accuracy.

FIGS. 1-8 illustrate an example for measuring the current on different phases of a motor. Although the example of FIGS. 1-8 is provided in the context of a motor control system, it will be understood that the present disclosure is not limited to any specific application of the process. In other words, the process may be used to measure the current on different phases of a multi-phase power supply irrespective of the application of the manner in which the power supply is used.

The concepts and ideas described herein may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, or volatile memory. The term unit (e.g., a addition unit, a multiplication unit, etc.), as used throughout the disclosure may refer to hardware (e.g., an electronic circuit) that is configured to perform a function (e.g., addition or multiplication, etc.), software that is executed by at least one processor, and configured to perform the function, or a combination of hardware and software.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A method for use in a controller, the method comprising:
receiving a first current measurement that is taken at a first predetermined time instant;
receiving a second current measurement that is taken at a second predetermined time instant;
classifying the first current measurement as corresponding to one of a plurality of electrical signals, the first current measurement being classified based, at least in part, on a duty cycle pattern of the plurality of electrical signals;
classifying the second current measurement as corresponding to another one of the plurality of electrical signals, the second current measurement being classified based, at least in part, on the duty cycle pattern of the plurality of electrical signals; and
adjusting a duty cycle of at least one of the electrical signals based on the first current measurement, the classification of the first current measurement, the second current measurement, and the classification of the second current measurement,
wherein the first current measurement and the second current measurement are taken by using a same shunt resistor.

2. The method of claim 1, wherein:
the first current measurement is taken after a first period has passed since a beginning of a PWM cycle,
the second current measurement is taken after a second period has passed since the beginning of the PWM cycle,
classifying the first current measurement based on the duty cycle pattern of the plurality of electrical signals includes classifying the first current measurement as belonging to one of the plurality of electrical signals that has a shortest duty cycle, and
classifying the second current measurement based on the duty cycle pattern of the plurality of electrical signals includes classifying the second current measurement as belonging to another one of the plurality of electrical signals that has a second shortest duty cycle.

3. The method of claim 1, wherein the first current measurement is taken in response to a first timer event, and the second current measurement is taken in response to a second timer event.

4. The method of claim 1, wherein each of the plurality of electrical signals has a different phase.

5. The method of claim 1, wherein adjusting the duty cycle of at least one of the plurality of electrical signals includes one of increasing a length of the duty cycle, decreasing the length of the duty cycle, or recalculating the length of the duty cycle.

6. The method of claim 1, wherein:
the plurality of electrical signals is generated, at least in part, by an electronic circuit, the electronic circuit being coupled in series with the shunt resistor,
the first current measurement identifies a level of an electrical current that is flowing through the shunt resistor at first time instant, and
the second current measurement identifies the level of the electrical current that is flowing through the shunt resistor at a second time instant.

7. The method of claim 1, wherein:
each of the plurality of electrical signals is generated in response to a respective control signal, the control signal specifying an on-time of the electrical signal as a portion of a PWM cycle, the PWM cycle being a reference time period that is used by the controller to control an operation of an electrical motor, the first current measurement is taken after a first time period has passed since a beginning of a current PWM cycle, and the second current measurement is taken after a second time period since the beginning of the current PWM cycle.

8. The method of claim 1, wherein each of the electrical signals is configured to drive a different one of a plurality of windings of an electrical motor.

9. The method of claim 1, wherein the controller includes a field-oriented control (FOC) controller.

10. A system, comprising:
a processing circuitry that is configured to:
receive a first current measurement that is taken at a first predetermined time instant;
receive a second current measurement that is taken at a second predetermined time instant;
classifying the first current measurement as corresponding to one of a plurality of electrical signals, the first current measurement being classified based, at least in part, on a duty cycle pattern of the plurality of electrical signals;
classifying the second current measurement as corresponding to another one of the plurality of electrical signals, the second current measurement being classified based, at least in part, on the duty cycle pattern of the plurality of electrical signals; and
adjusting a duty cycle of at least one of the electrical signals based on the first current measurement, the classification of the first current measurement, the second current measurement, and the classification of the second current measurement,
wherein the first current measurement and the second current measurement are taken by using a same shunt resistor.

11. The system of claim 10, wherein:
the first current measurement is taken after a first period has passed since a beginning of a PWM cycle,
the second current measurement is taken after a second period has passed since the beginning of the PWM cycle,
classifying the first current measurement based on the duty cycle pattern of the plurality of electrical signals includes classifying the first current measurement as belonging to one of the plurality of electrical signals that has a shortest duty cycle, and
classifying the second current measurement based on the duty cycle pattern of the plurality of electrical signals includes classifying the second current measurement as belonging to another one of the plurality of electrical signals that has a second shortest duty cycle.

12. The system of claim 10, wherein the first current measurement is taken in response to a first timer event, and the second current measurement is taken in response to a second timer event.

13. The system of claim 10, wherein each of the plurality of electrical signals has a different phase.

14. The system of claim 10, wherein adjusting the duty cycle of at least one of the plurality of electrical signals includes one of increasing a length of the duty cycle, decreasing the length of the duty cycle, or recalculating the length of the duty cycle.

15. The system of claim 10, wherein:
the plurality of electrical signals is generated, at least in part, by an electronic circuit, the electronic circuit being coupled in series with the shunt resistor,
the first current measurement identifies a level of an electrical current that is flowing through the shunt resistor at first time instant, and
the second current measurement identifies the level of the electrical current that is flowing through the shunt resistor at a second time instant.

16. The system of claim 10, wherein:
each of the plurality of electrical signals is generated in response to a respective control signal, the control signal specifying an on-time of the electrical signal as a portion of a PWM cycle, the PWM cycle being a reference time period that is used by the controller to control an operation of an electrical motor,
the first current measurement is taken after a first time period has passed since a beginning of a current PWM cycle, and
the second current measurement is taken after a second time period since the beginning of the current PWM cycle.

17. The system of claim 10, wherein each of the electrical signals is configured to drive a different one of a plurality of windings of an electrical motor.

18. The system of claim 10, wherein the system includes a field-oriented control (FOC) controller.

19. A non-transitory computer-readable medium storing one or more processor executable instructions, which when executed by a processing circuitry, further cause the processing circuitry to perform the operations of:
receiving a first current measurement that is taken at a first predetermined time instant;
receiving a second current measurement that is taken at a second predetermined time instant;
classifying the first current measurement as corresponding to one of a plurality of electrical signals, the first current measurement being classified based, at least in part, on a duty cycle pattern of the plurality of electrical signals;
classifying the second current measurement as corresponding to another one of the plurality of electrical signals, the second current measurement being classified based, at least in part, on the duty cycle pattern of the plurality of electrical signals; and
adjusting a duty cycle of at least one of the electrical signals based on the first current measurement, the classification of the first current measurement, the second current measurement, and the classification of the second current measurement,
wherein the first current measurement and the second current measurement are taken by using a same shunt resistor.

20. The non-transitory computer-readable medium of claim 19, wherein:
the first current measurement is taken after a first period has passed since a beginning of a PWM cycle,
the second current measurement is taken after a second period has passed since the beginning of the PWM cycle,
classifying the first current measurement based on the duty cycle pattern of the plurality of electrical signals includes classifying the first current measurement as belonging to one of the plurality of electrical signals that has a shortest duty cycle, and
classifying the second current measurement based on the duty cycle pattern of the plurality of electrical signals includes classifying the second current measurement as belonging to another one of the plurality of electrical signals that has a second shortest duty cycle.

21. The non-transitory computer-readable medium of claim 19, wherein the first current measurement is taken in response to a first timer event, and the second current measurement is taken in response to a second timer event.

22. A system, comprising:
a motor including a plurality of windings;
an electronic circuit configured to drive a different one of the plurality of windings with a different one of a plurality of electrical signals, each of the plurality of electrical signals being a pulse-width modulation (PWM) signal;
a shunt resistor that is coupled in series with the electronic circuit;
a processing circuitry that is operatively coupled the electronic circuit, the processing circuitry being configured to:
  obtain of a first current measurement by using the shunt resistor, the first current measurement being taken at a first predetermined time instant;
  obtain a second current measurement by using the shunt resistor, the second current measurement being taken at a second predetermined time instant;
classify the first current measurement as corresponding to one of a plurality of electrical signals, the first current measurement being classified based, at least in part, on a duty cycle pattern of the plurality of electrical signals;
classify the second current measurement as corresponding to another one of the plurality of electrical signals, the second current measurement being classified based, at least in part, on the duty cycle pattern of the plurality of electrical signals; and
adjust a duty cycle of at least one of the electrical signals based on the first current measurement, the classification of the first current measurement, the second current measurement, and the classification of the second current measurement.

23. The system of claim 22, wherein:
the first current measurement is taken after a first period has passed since a beginning of a PWM cycle,
the second current measurement is taken after a second period has passed since the beginning of the PWM cycle,
classifying the first current measurement based on the duty cycle pattern of the plurality of electrical signals includes classifying the first current measurement as belonging to one of the plurality of electrical signals that has a shortest duty cycle, and
classifying the second current measurement based on the duty cycle pattern of the plurality of electrical signals includes classifying the second current measurement as belonging to another one of the plurality of electrical signals that has a second shortest duty cycle.

24. A system comprising:
means for receiving a first current measurement that is taken at a first predetermined time instant;
means for receiving a second current measurement that is taken at a second predetermined time instant;
means for classifying the first current measurement as corresponding to one of a plurality of electrical signals, the first current measurement being classified based, at least in part, on a duty cycle pattern of the plurality of electrical signals;
means for classifying the second current measurement as corresponding to another one of the plurality of electrical signals, the second current measurement being classified based, at least in part, on the duty cycle pattern of the plurality of electrical signals; and
means for adjusting a duty cycle of at least one of the electrical signals based on the first current measurement, the classification of the first current measurement, the second current measurement, and the classification of the second current measurement.

25. The system of claim 24, wherein:
the first current measurement is taken after a first period has passed since a beginning of a PWM cycle,
the second current measurement is taken after a second period has passed since the beginning of the PWM cycle,
classifying the first current measurement based on the duty cycle pattern of the plurality of electrical signals includes classifying the first current measurement as belonging to one of the plurality of electrical signals that has a shortest duty cycle, and
classifying the second current measurement based on the duty cycle pattern of the plurality of electrical signals includes classifying the second current measurement as belonging to another one of the plurality of electrical signals that has a second shortest duty cycle.

* * * * *

UNITED STATES PATENT AND TRADEMARK OFFICE
CERTIFICATE OF CORRECTION

PATENT NO. : 11,658,597 B1
APPLICATION NO. : 17/645118
DATED : May 23, 2023
INVENTOR(S) : Anton Babushkin et al.

It is certified that error appears in the above-identified patent and that said Letters Patent is hereby corrected as shown below:

In the Specification

Column 2, Line 23 delete "coupled the" and replace with --coupled to the--.

Column 2, Line 25 delete "obtain of a" and replace with --obtain a--.

Column 4, Line 6 delete ", and or" and replace with --, and/or--.

Column 4, Lines 51-52 delete "logic-high to logic-low." and replace with --logic-low to logic-high.--.

Column 7, Line 9 delete ". It this this" and replace with --. In this--.

Column 7, Line 12 delete ". –FIG." and replace with --. FIGS.--.

Column 7, Line 17 delete "shown on in" and replace with --shown in--.

Column 7, Line 19 delete "shows a an" and replace with --shows an--.

Column 8, Line 3 delete ". Table 5" and replace with --. Table 500--.

Column 8, Line 8 delete ". Table 5" and replace with --. Table 500--.

Column 8, Line 35 delete "duty c cycle" and replace with --duty cycle--.

Column 8, Line 45 delete "$T_{HSONT\_B}$." and replace with --$T_{HSON\_B}$.--.

Column 8, Line 47 delete "$T_{HSONT\_C}$." and replace with --$T_{HSON\_C}$.--.

Column 8, Line 53 delete ", and DC_B" and replace with --, and DC_C--.

Signed and Sealed this
Twenty-sixth Day of March, 2024

*Katherine Kelly Vidal*

Katherine Kelly Vidal
*Director of the United States Patent and Trademark Office*

CERTIFICATE OF CORRECTION (continued)
U.S. Pat. No. 11,658,597 B1

Column 8, Line 59 delete "$T_{MCAB}$" and replace with --$T_{MCACB}$--.

Column 9, Line 12 delete "signal" and replace with --signals--.

Column 9, Line 57 delete "after the second." and replace with --after the first.--.

Column 9, Line 59 delete "and or" and replace with --and/or--.

Column 10, Line 39 delete "one signals" and replace with --one of signals--.

Column 10, Line 60 delete "possible and constant" and replace with --possible constant--.

Column 11, Line 10 delete "measurements" and replace with --measurement--.

Column 11, Line 53 delete ", a addition" and replace with --, an addition--.

In the Claims

Column 12, Line 59 delete "at first time" and replace with --at the first predetermined time--.

Column 12, Line 62 delete "a second time" and replace with --the second predetermined time--.

Column 14, Line 7 delete "at first time" and replace with --at the first predetermined time--.

Column 14, Line 10 delete "a second time" and replace with --the second predetermined time--.

Column 15, Line 17 delete "coupled the" and replace with --coupled to the--.

Column 15, Line 20 delete "obtain of a" and replace with --obtain a--.